(12) United States Patent
Anders (10) Patent No.: US 9,455,057 B2
(45) Date of Patent: Sep. 27, 2016

(54) METHOD AND APPARATUS FOR SPUTTERING WITH A PLASMA LENS

(71) Applicant: The Regents of the University of California, Oakland, CA (US)

(72) Inventor: Andre Anders, El Cerrito, CA (US)

(73) Assignee: The Regents of the University of California, Oakland, CA (US)

(*) Notice: Subject to any disclaimer, the term of this patent is extended or adjusted under 35 U.S.C. 154(b) by 921 days.

(21) Appl. No.: 13/645,962

(22) Filed: Oct. 5, 2012

(65) Prior Publication Data

US 2013/0043121 A1 Feb. 21, 2013

Related U.S. Application Data

(63) Continuation-in-part of application No. PCT/US2011/031566, filed on Apr. 7, 2011.

(60) Provisional application No. 61/324,058, filed on Apr. 14, 2010.

(51) Int. Cl.
*C23C 14/35* (2006.01)
*G21K 1/087* (2006.01)
*H01J 37/32* (2006.01)
*H01J 37/34* (2006.01)

(52) U.S. Cl.
CPC ......... *G21K 1/087* (2013.01); *H01J 37/32697* (2013.01); *H01J 37/3408* (2013.01); *H01J 37/3467* (2013.01)

(58) Field of Classification Search
CPC .............. C23C 14/35; H01J 37/32697; H01J 37/3408; H01J 37/3467; H01J 37/3438; H01J 37/3447

USPC .......... 204/298.06, 298.14, 192.12
See application file for complete search history.

(56) References Cited

U.S. PATENT DOCUMENTS

| | | | |
|---|---|---|---|
| 4,287,419 A | 9/1981 | Booth | |
| 5,800,688 A * | 9/1998 | Lantsman | H01J 37/321 204/192.12 |
| 5,840,167 A * | 11/1998 | Kim | H01J 37/32357 204/298.05 |
| 6,423,192 B1 * | 7/2002 | Wada | C23C 14/046 204/192.12 |
| 6,943,351 B2 | 9/2005 | Parker et al. | |

(Continued)

OTHER PUBLICATIONS

M. Stetter et al., "The high current plasma lens: investigations of fine focusing of high energy heavy 1-7 ion beams." Fusion Engineering and Design 32-33, pp. 503-509 (1996).

(Continued)

*Primary Examiner* — Rodney McDonald
(74) *Attorney, Agent, or Firm* — Lawrence Berkeley National Laboratory (57) ABSTRACT

A plasma lens for enhancing the quality and rate of sputter deposition onto a substrate is described herein. The plasma lens serves to focus positively charged ions onto the substrate while deflecting negatively charged ions, while at the same time due to the line of sight positioning of the lens, allowing for free passage of neutrals from the target to the substrate. The lens itself is formed of a wound coil of multiple turns, inside of which are deposed spaced lens electrodes which are electrically paired to impress an E field overtop the B field generated by the coil, the potential applied to the electrodes increasing from end to end towards the center of the lens, where the applied voltage is set to a high potential at the center electrodes as to produce a potential minimum on the axis of the lens.

20 Claims, 4 Drawing Sheets

(56) References Cited

U.S. PATENT DOCUMENTS

| | | |
|---|---|---|
| 7,391,037 B2 | 6/2008 | Kruit |
| 2002/0134668 A1* | 9/2002 | Wan .................... C23C 14/044 |
| | | 204/192.11 |
| 2008/0264777 A1* | 10/2008 | Ye .................... C23C 14/0036 |
| | | 204/192.25 |
| 2011/0089024 A1 | 4/2011 | Anders |

OTHER PUBLICATIONS

A. A. Goncharov, I. M. Protsenko, G. Y. Yushkov, and I. G. Brown, "Focusing of high-current, large-area, heavy-ion beams with an electrostatic plasma lens," Appl. Phys. Lett., vol. 75 No. 7, pp. 911-913 (1999).

A. A. Goncharov, I. M. Protsenko, G. Y. Yushkov, and I. G. Brown, "Manipulating large-area, heavy metal ion beams with a high-current electrostatic plasma lens," IEEE Trans. Plasma Sci., vol. 28, pp. 2238-2246, (2000).

W. Barletta, S. Chattopadhyay, P. Chen, O. Cline, et al., "Plasma lens experiments at the final focus test beam," presented at the 6th Workshop on Advanced Accelerator Concepts, Lake Geneva, WI, (1994).

B. Barletta, S. Chattopadhyay, P. Chen, O. Cline, et al., "Plasma lens experiments at the final focus test beam," Proceedings of the 1993 IEEE Particle Accelerator Conference, Washington, D.C., vol. 4, pp. 2638-2640, (1993).

P. K. Roy, P. A. Seidl, A. Anders, et al., "A space-charge-neutralizing plasma for beam drift compression," Nucl. Instrum. Meth. Phys. Res. A, vol. 606, pp. 22-30, (2009).

International Search Report and Written Opinion for International Application No. PCT/US11/31566 mailed Aug. 15, 2011.

A. Anders et al., "A Plasma Lens for Magnetron Sputtering," IEEE Transactions on Plasma Science, vol. 39, No. 11, Nov. 2011, pp. 2528-2529.

E. Byon et al., "Bias and self-bias of magnetic macroparticle filters for cathodic arc plasmas," J. Appl. Phys., vol. 93, pp. 8890-8897, 2003.

A. Anders, "Imaging the separation of cathodic arc plasma and macroparticles in curved magnetic filters," IEEE Trans. Plasma Sci., vol. 30, No. 1, pp. 108-109, Feb. 2002.

J. Bohlmark et al., "Guiding the deposition flux in an ionized magnetron discharge," Thin Solid Films, vol. 515, No. 4, pp. 1928-1931, Dec. 2006.

\* cited by examiner

METHOD AND APPARATUS FOR SPUTTERING WITH A PLASMA LENS

CROSS REFERENCE TO RELATED APPLICATIONS

This application is a continuation-in-part of International Application No. PCT/US2011/031566, with an international filing date of Apr. 7, 2011, which claims the benefit of U.S. Provisional Application No. 61/324,058, filed Apr. 14, 2010, both of which are herein incorporated by reference.

STATEMENT OF GOVERNMENTAL SUPPORT

Embodiments described and claimed herein were made in part utilizing funds supplied by the U.S. Department of Energy under Contract No. DE-AC02-05CH11231 between the U.S. Department of Energy and the Regents of the University of California for the management and operation of the Lawrence Berkeley National Laboratory. The government has certain rights in this invention.

TECHNICAL FIELD

Embodiments disclosed herein relate generally to methods and apparatus for thin film sputter deposition, and more specifically to a novel plasma lens for use in conjunction with magnetron sputtering, the lens configured to deflect negatively charged ions such that they do not strike the surface of the substrate to be coated.

BACKGROUND

Transparent conducting oxides are often deposited using magnetron sputtering due to scalability, reasonable cost, and quality. However, the desired oxide properties, including high conductivity and high transmittance, are usually less than optimum due to damage of the growing film caused by energetic particles. Examples of transparent conducting oxides include indium tin oxide (ITO) and aluminum doped zinc oxide (AZO).

The sputtering process necessarily makes use of positive ions accelerated towards the target to cause sputtering of the target material. A small fraction of ions "bounce" back as energetic atoms. The other energetic particles in the case of transparent conducting oxide sputtering are usually negative oxygen ions that are accelerated away from the target by the same field that accelerated positive ions toward the target. Both types of energetic particles, atoms and negative ions, can cause defects in the growing film, which may manifest themselves as scattering centers for electric carries, lowering their mobility, and as absorptions centers, lowering their transmittance. Therefore, in order to make a transparent conducting oxide, the bombardment with energetic particles needs to be eliminated or at least reduced.

The formation of energetic particles is inherently connected with the magnetron sputtering process. Therefore, one way of addressing the problem is to deal with energetic particles after their formation, but before they arrive at the substrate. In one approach, the process gas pressure is increased beyond the typical 1 to 10 millitorr in order to increase the likelihood of collisions between ions and atoms, thereby reducing the kinetic energy of the ions. This approach, however, will also cause collisions of the lower energy particles, especially sputtered atoms, which leads to a reduction in deposition rate and deterioration of film quality (e.g., voids in the film, reduced adhesion). In another approach, a blocking element or a shield (or shields) is placed over the racetrack of the magnetron target in order to block the harmful energetic ions that are mostly produced near the racetrack. This approach has the disadvantages that the blocking element gets coated and may produce particulates, and that the deposition rate is reduced. In still another approach, the substrate is placed off-axis such to avoid the impact of negative ions. As with the previous approach, the deposition rate is much reduced.

Plasma transport is well studied for filtered cathodic arc deposition. Electrons are magnetized by the magnetic field of a filter coil; the purpose of the filter to separate the cathodic arc plasma from the macroparticles that are also produced at cathode spots. In the filter, the electrons gyrate around the magnetic field lines and are thereby bound to the field. The center of the gyration motion is called the gyration center (of that motion). The gyration center is moving along the field lines unless a collision of the electron with an atom or an ion displaces it by about one gyration radius, after which the electron is bound to the neighboring magnetic field line. Since the field is curved in this specific configuration of a macroparticle filter, one can guide the electrons from the source to the substrate that is not in line-of-sight with the source.

As it is characteristic for plasmas, electron motion is coupled to positive ion motion by the Coulomb interaction. Thus, it is not possible to guide electrons away from the source without affecting the positive ions. As a result, the electrons and positive ions are moving together, where the transport mechanism is a combined magnetic (for electrons) and electric (for positive ions) mechanism. This is all well known for filters used in filtered cathodic arc deposition; a comprehensive review of theory and experiment was published in chapter 7 of the book "Cathodic Arcs" by A. Anders, New York: Springer, 2008.

The production of energetic negative ions in magnetron sputtering has been recognized, with the presence of such ions being detrimental to high quality film formation. Their impact causes displacements of lattice atoms in the coating and thereby the growth of crystalline grains is disturbed. The films are highly defective on an atomic level or from a crystallographic point of view. In essence, the electric field near the target, which is responsible for accelerating positive ions towards the target such as to cause sputtering from the target, is also responsible for accelerating negative ions (such as $O^-$, $O_2^-$) away from the target and towards the substrate. The highest energy that a negative ion can obtain corresponds to the full applied target voltage (e.g., a 500 V target bias can create a 500 eV negative ion flying from the target to the substrate to be coated). This has been published, for example, in S. Mráz, and J. M. Schneider, "Energy distribution of $O^-$ ions during reactive magnetron sputtering," Appl. Phys. Lett., vol. 89, no. 5, pp. 051502-3, 2006.

SUMMARY

According to embodiments disclosed herein, one solution to the energetic negative ion issue is to remove the ions before they can reach the substrate. This can be done by placing a plasma lens between the region where the energetic negative ions are produced (near the target region) and the substrate. Specifically, a plasma lens can be placed such that the line of sight between target and substrate is maintained; hence high deposition rates can be retained. Further, in this process one is not limited to HIPIMS or HIPIMS-like magnetron discharges, but rather the process can be practiced for a much wider class of sputtering setups simply by providing a plasma lens that defocuses the flow of negative ions such that they do not reach the substrate.

In this approach the negative ions are bent away so that they do not strike the substrate being coated, while the positive ions are more focused onto the substrate. The focusing of the positive ions can locally improve film growth because they are of low energy, typically in the electron-volt energy region, and thereby assist film growth via enhancing surface atom mobility. "Low energy" in this context is ion energy lower than the displacement energy of atoms in the growing films, which is generally about 20 eV to 40 eV. In addition, neutrals of the plasma are not affected, and thus due to the line of sight aspects of the lens, they can reach the substrate too, thereby increasing the rate of deposition. Notably, allowing the neutrals to reach the substrate is important due to the fact that the majority of particles in the plasma beam are in fact neutrals. It was found that this arrangement is particularly useful in the deposition of oxide films.

In one aspect, a plasma lens includes a lens coil including multiple turns and a first power supply configured to apply power to the lens coil to generate a magnetic field that forms or forming lines of equipotential in the presence of a plasma. The plasma lens is configured for dispersing negatively charged particles away from a center of the plasma lens as the negatively charged particles pass through the plasma lens while focusing positively charged particles to the center of the plasma lens as the positively charged particles pass though the plasma lens.

In some embodiments, the plasma lens further includes a plurality of ringed lens electrodes symmetrically disposed within the lens coil, a center of symmetry being at the center of the lens. A second power supply may be configured to apply power to pairs of ringed lens electrodes to the same electric potential or configured to apply potential to pairs of ringed lens electrodes. In some embodiments, different pairs of ringed lens electrodes are configured to have different potentials applied to them. A center pair of ringed electrodes is configured to have a high potential applied to it to generate a potential minimum near an axis of the plasma lens. In some embodiments, the second power supply may be configured to apply a high potential to the center pair of ringed lens electrodes and to apply lower potentials to other pairs of ringed lens electrodes, the potential decreasing in a direction moving away from the center of the lens.

In some embodiments, the plasma lens has a cylindrical shape with a substantially circular cross-section. In some other embodiments, the plasma lens has an elongated cross-section, wherein one dimension is substantially larger than a dimension substantially perpendicular to it, yielding a flat-elliptical or rectangular cross-section.

In some embodiments, the second power supply includes a plurality of power supplies. In some other embodiments, the second power supply includes a single power supply including a stiff voltage divider.

In another aspect, an apparatus includes a magnetron source, a target holder configured to hold a target, a support configured to hold a substrate upon which a film containing material from the target is to be deposited, and a plasma lens. The support is positioned opposite the target. The plasma lens is disposed between the magnetron source and the support and defines a line of sight path from the target to the support.

In some embodiments, the plasma lens includes a lens coil including multiple turns and a first power supply configured to apply power to the lens coil to generate a magnetic field including lines of equipotential. In some embodiments, the plasma lens further includes a plurality of ringed lens electrodes symmetrically disposed within the lens coil, a center of symmetry being at a center of the plasma lens. A second power supply is configured to apply power to pairs of ringed lens electrodes to the same electric potential. In some embodiments, the second power supply is configured to apply a high potential to pairs of ringed lens electrodes closest to the center of the plasma lens and is configured to apply a potential to other pairs of ringed lens electrodes with the potential decreasing axially in a direction moving away from the center of the lens.

In some embodiments, the apparatus further includes a heater associated with the support. In some embodiments, the apparatus further includes a shield disposed between the support and an end of the plasma lens proximate the support. The shield is configured to intercept negative ions which have traveled through the plasma lens from the target towards the support.

In another aspect, a method of depositing a film includes providing an apparatus. The apparatus may include a magnetron source, a target holder configured to hold a target, a support configured to hold a substrate upon which a film containing material from the target is to be deposited, and a plasma lens. The substrate support is positioned opposite the target. The plasma lens is disposed between the magnetron source and the support and defines a line of sight path from the target to the support. The substrate is positioned on the support. A potential is applied to the target. An ionized plasma is formed with a sputtering gas. A potential is applied to the plasma lens to generate a magnetic field.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION

One need is a high rate deposition process that is capable of delivering superior films, more particularly oxide films and especially transparent conducting oxide films characterized by high transmittance, low sheet resistance, and high carrier mobility. Ideally, such a method needs to addresses the negative ion damage for all kinds of magnetron sputtering, including HIPIMS (HIgh Power Impulse Magnetron Sputtering) but also more traditional DC (direct current), RF (radio-frequency), and MF (medium-frequency) sputtering.

According some embodiments, a plasma lens is used to defocus the flow of negative ions in such a way that they are lost to the side and therefore do not impact the surface of the growing film. This can generally be accomplished by placing an axial magnetic field (e.g., produced by a coil) between the sputtering target and the to-be-coated substrate and making sure that the coil is filled with plasma. The initial escape of some positive plasma ions from the lens setup creates a small charge imbalance inside the lens such that the magnetized plasma electrons form a locally low potential. A low potential on axis implies a radial electric field, focusing positive ions and de-focusing negative ions. The aforementioned needs are satisfied by the process of the present embodiment which comprises using a magnetron at the entrance of the plasma lens, a plasma lens solenoid magnetic field, plasma lens electrodes that determine the electric potential of the magnetic field lines, and a substrate at the exit of the plasma lens.

In some embodiments, a plurality of matched sets of paired electrodes is used to establish a controlled profile for the electric field. In some embodiments, the plasma lens can be operated without the use of the electrodes. Thus, the lens can be supplied either with both a lens coil and paired electrodes, the use of which electrodes in one mode of operation can be eliminated. In another embodiment, the paired electrodes and their associated power supplies can be eliminated altogether, thus increasing the simplicity of the plasma lens, and reducing costs, by utilizing the spontaneous formation of a low potential on axis.

Figure 1:
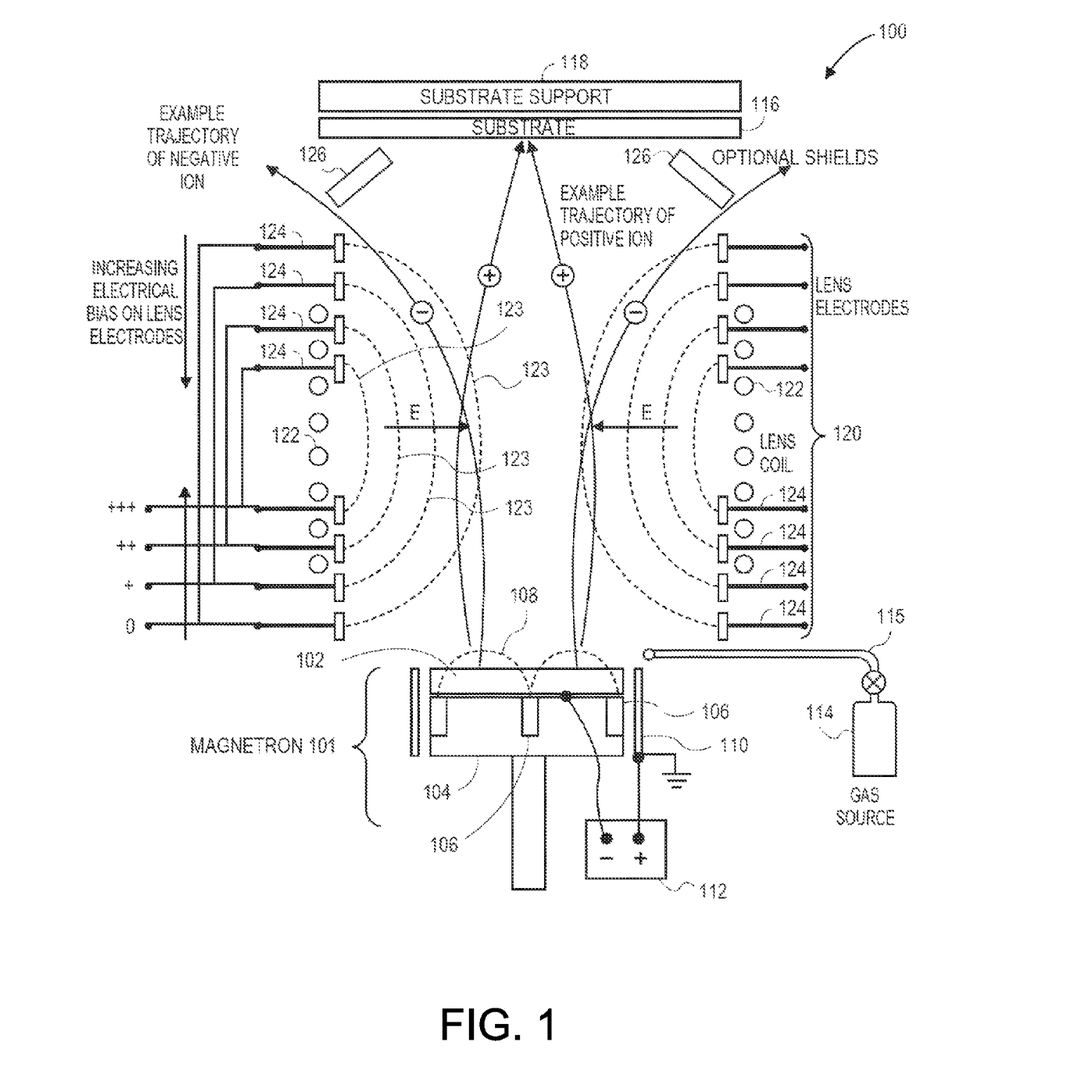
FIG. 1 is a schematic of a principal arrangement of a plasma lens between a magnetron and the substrate, the plasma lens including both a lens coil and sets of paired ringed electrodes. The dashed lines represent magnetic field lines.

Turning now to one embodiment, to establish the necessary controlled profile of the electric field it is best to terminate the magnetic field lines by letting them intersect a metal of controlled electrical potential as shown in FIG. 1. Thus, in one embodiment, the plasma lens includes both a lens coil and paired sets of metal rings, i.e., lens electrodes, with separate DC power feeds to each of the ringed electrodes in order to maintain them at different potentials. This can be provided by a single power supply utilizing a stiff voltage divider, or separate power supplies, one used to power each of the paired ring electrodes. The ringed electrodes themselves are disposed inside the coil which produces the magnetic solenoid field. In this embodiment, the magnetic (B) field is first established, and then a symmetrically non-uniform electric field super-imposed where the potential of the electric field decreases towards the midpoint of the plasma lens (i.e., the center of the field coil), as illustrated in FIG. 1.

The arrangement is substantially symmetric to the axis as well as to the middle plane, and therefore there is no net acceleration or deceleration in the axial direction. In the radial direction, however, the electric field, pointing to the axis, will accelerate positive ions towards the axis while negative ions are accelerated away from the axis. As a result, the positive ions are focused and transported through the lens structure while the negative ions are defocused and lost to the side. The maximum voltage (in volts) applied to the lens electrode (closest the center of the field coil) is of the same order of magnitude as the energy of ions (in electron-volt) to be deflected. More precisely, the focal length for focusing can be determined by the following formula (see equation (3) of Goncharov et al., Appl. Phys. Lett., vol. 75, pp. 911-913, 1999.):

$$f \approx \frac{\pi}{2} \frac{R_{lens}}{L_{lens}} \frac{E_{ion}}{eV_{lens}},$$

where R and L are the radius and length of the lens, $E_{ion}$ is the ion energy (in eV), and $V_{lens}$ is the maximum voltage applied to the center plasma lens electrode. Since the focusing refers to positive ions, whereas negative ions are de-focused, the polarity of the lens bias is important, namely, the pair of electrodes connected to the inner-most, near-axis field lines is negative relative to the pair of electrodes placed closer to the middle of the lens where field lines do not reach the axis. In FIG. 1, the former are labeled "0" and latter "+++".

Again with reference to FIG. 1, a magnetron unit is depicted wherein a vacuum chamber 100 (not shown) houses a magnetron 101 to which a target 102 has been mounted to a support 104, with magnets 106 embedded in the support to create magnetic flux lines adjacent the target 102, as represented by the dotted lines 108. The operation of the sputtering magnetron is based on the magnetically enhanced glow discharge, where the "target" is the cathode of the discharge and nearby metal member 110 comprises the anode. The target 102 is impressed with a negative potential, using a power source 112. The power source 112 may be a DC power source, a pulsed-DC power source, or a pulsed-DC with high power power source, in some embodiments. The power source 112 may be a medium frequency (MF) power source, in some embodiments. When the power source is a MF power source, a negative target potential may be established by so-called self-biasing. The anode is often a grounded cylinder or similar structure. The target support 104 may be water-cooled as it will heat up in the sputtering process. Sputtering process gas is used for the discharge. For pure metal deposition it is common to use argon, a noble gas which does not participate in the film formation on the substrate. The sputtering gas from gas source 114 can be introduced into the chamber, in one embodiment adjacent the target via gas line(s) 115. For the deposition of compound films, like oxides, argon can be mixed with a desired reactive gas, like oxygen in the case of oxides.

The electric field of the discharge will accelerate positive gas ions to the target where they sputter ("chip off") atoms of the target material. Many of those sputtered atoms will end up on the substrate, forming the film. Some of the sputtered atoms may become ionized and either contribute to sputtering of the target (which is important for the specific case of HIPIMS), or they may assist film growth on the substrate. Deposition by magnetron sputtering is well established and described in several text books, for example in W.D. Westwood, Sputter Deposition, AVS Education Committee Book Series, vol. 2, AVS, New York, (2003). At the other end of the chamber is substrate 116 which is to be coated. The substrate may be negatively charged to attract positive ions from the magnetron generated plasma. The substrate may also be heated using a heater disposed in or associated with substrate support 118; a heater may be useful in the case of reactive deposition. By mechanisms not shown, the substrate can be caused to move over the substrate support in a continuous direction so as to sequentially allow for coating the substrate. Movement is also known to improve the uniformity of the coating.

It should be appreciated that in the case of the deposition/film formation of transparent oxide films, where such films are commonly deposited on non-conducting glass substrates, no bias is applied. For silicon or other conducting substrates, however, the application of a negative bias may be useful to increase the energy of the positive ions up to a certain value as they move to the substrate. The optimum energy, determining which bias is preferred, depends on the material. It is generally limited by possible ion damage that occurs when the film material's displacement energy, typically 20 eV to 40 eV, is exceeded.

Interspaced between the magnetron and the substrate is plasma lens 120 which in some embodiments comprises two elements. The first is a lens coil 122 which is sized to surround the generated plasma. The lens coil is used to produce a solenoid magnetic field, designated by magnetic field lines 123. In some embodiments, turns of thick copper wire or water-cooled copper tubing, e.g., about ¼ inch diameter tubing, can be used for the lens coil and DC current can be provided through this coil to produce the desired magnetic field, with the coil being provided with its own power supply. The magnetic field strength should be sufficient to magnetize electrons. If, for example, about 10 turns are used for a length of 10 cm, the current should be at least about 100 A. More generally, in some embodiments the coil can be one with 100 A-turns per centimeter. That is, the coil may include one turn with 100 Ampere flowing through it, or equivalently 100 turns with 1 Ampere flowing through it, or 10 turns with 10 Amperes flowing through it, and the like. In all cases the magnetic field is the same. In some embodiments, the copper coil may be water cooled by having water run through its hollow core. In some embodiments, the copper tubing can be disposed inside the chamber, which may make it easier to form the coil, regardless of the constraints that might be imposed by the shape of the sputtering chamber. In some embodiments, the coil can be positioned outside the sputtering chamber.

The second component comprises a series of symmetrically disposed lens electrodes 124, with the center of symmetry at the center of the lens, which lens electrodes are separate from one another and held at different electrical potentials. The pairs of powered electrodes have a sequenced potential with the highest potential at the center of the lens. As illustrated in FIG. 1, the lens electrodes, by way of example, are held at uniformly increasing electrical bias potential as one moves from the ends to the center of the lens such that the most positive bias potential is provided at the central electrodes of the lens leading to a potential minimum on the axis of the lens. This results in an established electrical field as shown in the figure. In operation with this configuration, positive ions leaving the target zone of the magnetron are directed towards the substrate to be coated, while the paths of the negative ions are bent outwardly, away from the substrate. In the embodiment illustrated, optional shields 126 are provided near the surface of substrate 116 upon which negative ions may impact.

In some embodiments, the use of the ring electrodes can be eliminated, and films of satisfactory/improved properties can still obtained. In some embodiments, the presence of the electrodes themselves along with their supporting power supplies can be eliminated, resulting in a simplified form of the plasma lens. Even this simplified form, the plasma lens not only suppresses the transport of negative ions, but also promotes the transport of film forming positive ions. Thus per the data below, films made with the simplified lens were thicker, evidencing a higher deposition rate. Visual inspection of the films showed no noticeable variation in film structure across the surface. For a deposition using an Zn:Al target, an increase in carrier concentration, $(n_e)$, a dramatic increase in the mobility ($\mu$), and a decrease in resistivity ($\rho$) by several orders of magnitude, were observed.

TABLE 1

| Deposition Method | Thickness (nm) | $n_e$ (cm$^{-3}$) | $\mu$ (cm$^2$/Vs) | $\rho$ ($\Omega$ cm) |
| --- | --- | --- | --- | --- |
| HIPIMS | 90 | $5.8 \times 10^{20}$ | 0.553 | $1.9 \times 10^{-2}$ |
| Filtered HIPIMS | 180 | $1.3 \times 10^{21}$ | 6.05 | $7.9 \times 10^{-4}$ |

Figure 2:
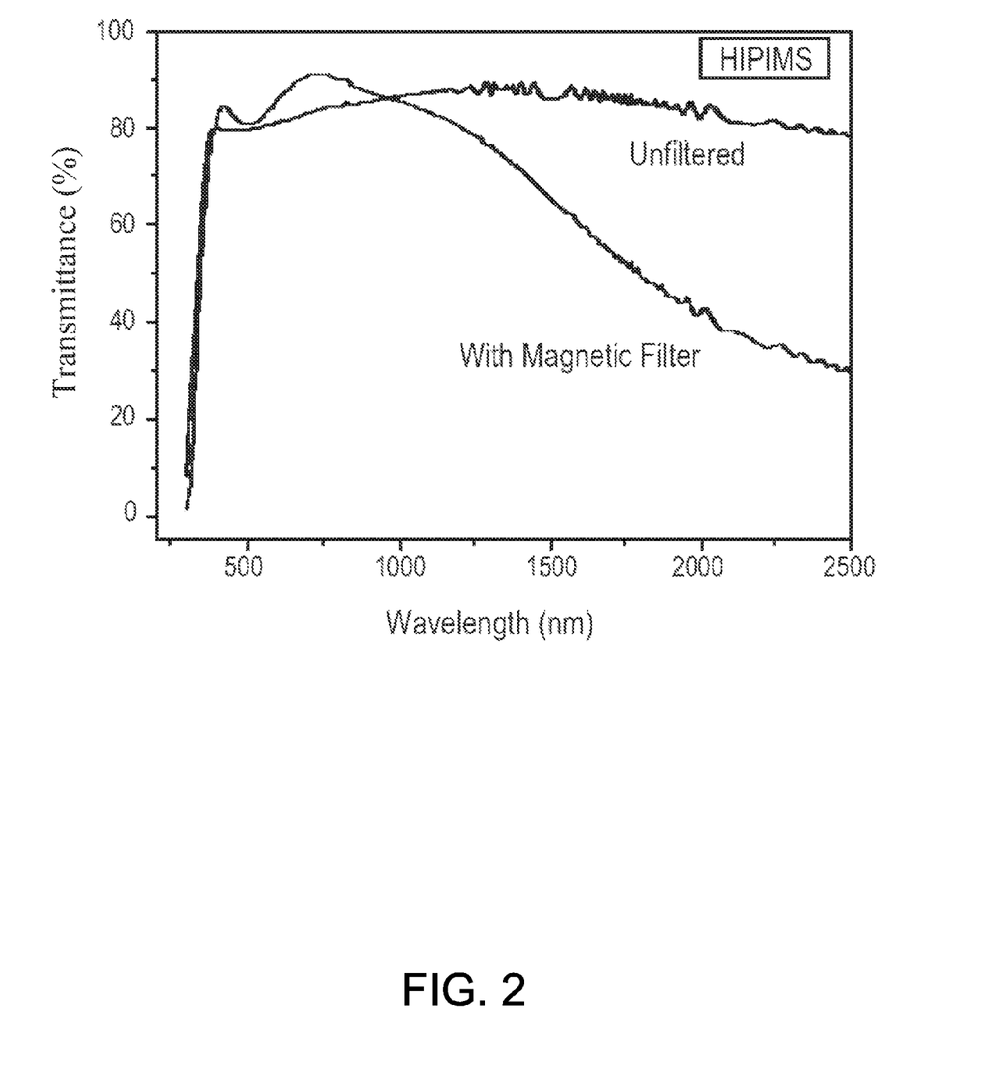
FIG. 2 is plot of transmittance as a function of wavelength for HIPIMS samples deposited both with and without use of the plasma lens of some embodiments, where the plasma lens comprised a coil alone.

FIG. 2 shows a plot including the transmittance as a function of wavelength for HIPIMS samples deposited with and without using a plasma lens. It can be seen that despite being twice as thick, the filtered HIPIMS sample had a higher transmittance in the optical (400 nm to 700 nm) region of the spectrum. The filtered HIPIMS film shows reduced transmittance for wavelengths greater than 1000 nm in the near infrared, which is expected from the presence of an improved (higher) carrier concentration. Such higher concentration or density is known to lead to infrared light reflection on the low-frequency side (long wavelength side) of the so-called plasma edge, which is described in most textbooks on semiconductors; for example, see page 310 of P. Y. Yu, and M. Cardona, *Fundamentals of Semiconductors*, Berlin: Springer, 2010.

Figure 3:
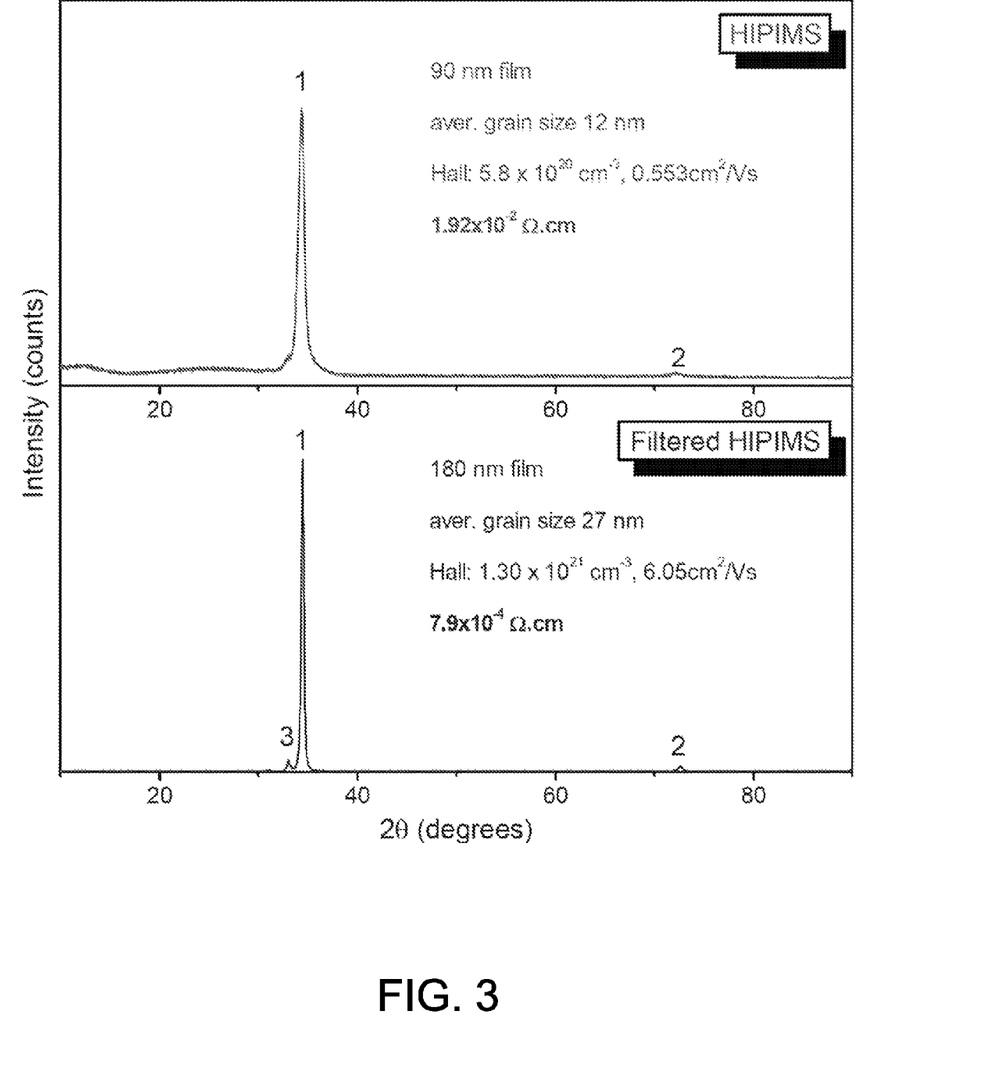
FIG. 3 are XRD comparison plots of film properties for film samples grown with and without a plasma lens, where the plasma lens comprised a coil alone.

With reference to FIG. 3, XRD (x-ray diffraction) of the HIPIMS samples deposited with and without the use of the plasma lens are compared. The peaks in the spectra for the film produced with the lens are more intense and more clearly resolved, indicating that the insertion of the lens gives rise to a greater preferred orientation of the (002) planes (peaks 1 and 2). Average grain size was also determined using the Scherrer equation, and the results shown in Table 2. It can be seen from this that by using a straight plasma lens in a HIPIMS setup, crystallinity is promoted as evident by the growth of larger grains.

TABLE 2

| Sample | Thickness (nm) | $2\theta_B$ (deg) | FWHM (deg) | D (nm) |
| --- | --- | --- | --- | --- |
| HIPIMS (filtered) | 180 | 34.50 | 0.31 | 27 |
| HIPIMS (unfiltered) | 90 | 34.38 | 0.68 | 12 |

Figure 4:
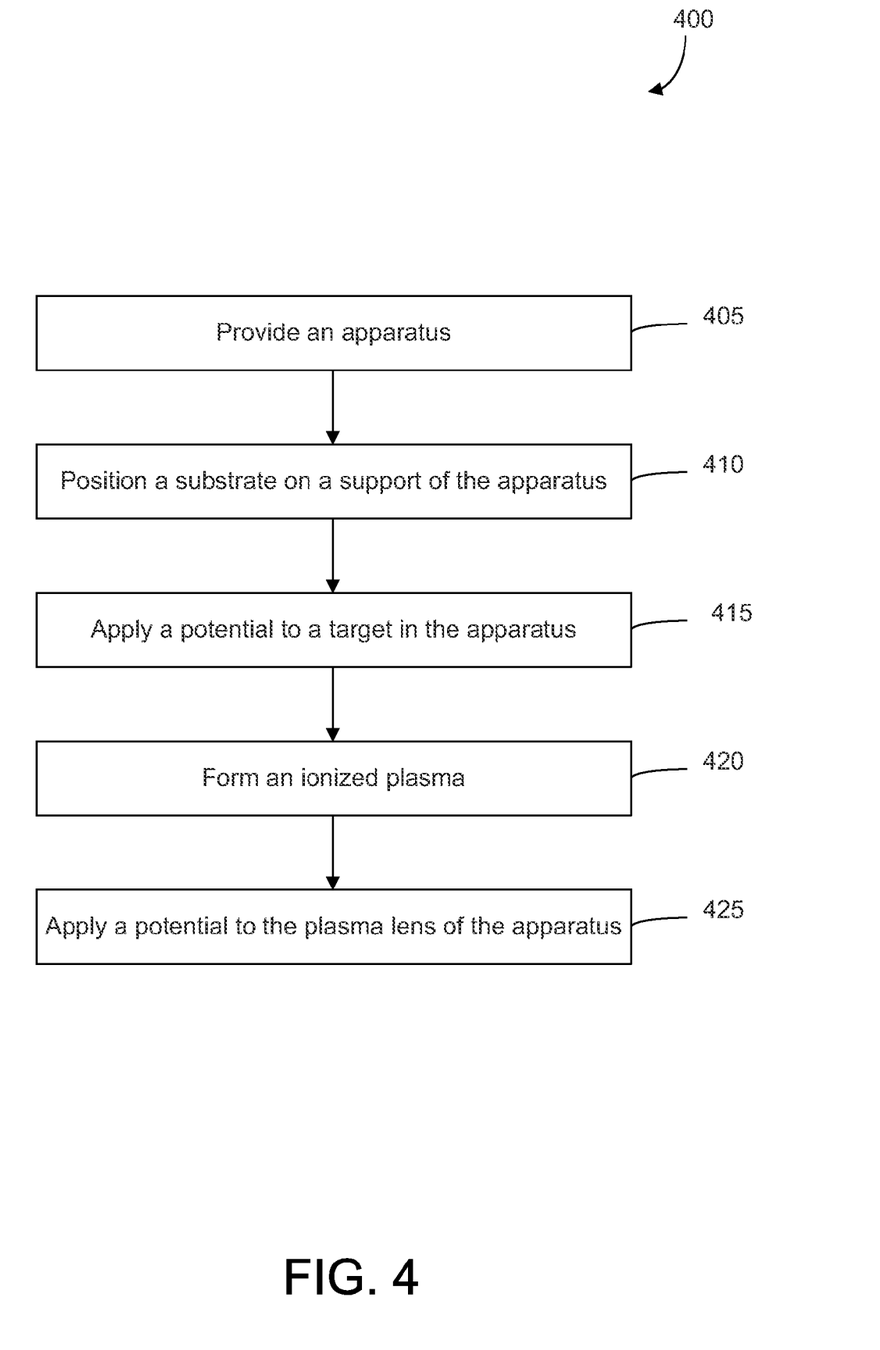
FIG. 4 shows an example of a process of sputtering a film.

FIG. 4 shows an example of a process of sputtering a film. In operation 405 of the process 400, an apparatus is provided. In some embodiments, the apparatus includes a magnetron source, a target holder configured to hold a target, a support configured to hold a substrate upon which a film containing material from the target is to be deposited, and a plasma lens. The substrate support is positioned opposite the target. The plasma lens is disposed between the magnetron source and the support and defines a line of sight path from the target to the support.

In operation 410, a substrate is positioned on the support of the apparatus. In some embodiments, the substrate is heated when depositing the film. In operation 415, a potential is applied to a target in the apparatus. In some embodiments, the target is cooled when depositing the film.

In operation 420, an ionized plasma is formed. The ionized plasma may be formed when a sputtering gas introduced into the chamber. For example, in some embodiments, the film to be deposited is doped ZnO. The target may comprise doped Zn, and oxygen may be introduced along with argon sputtering gas into the apparatus. In operation 425, a potential is applied to the plasma lens of the apparatus.

In some embodiments, the plasma lens includes a lens coil including multiple turns and a first power supply configured to apply power to the lens coil to generate a magnetic field including lines of equipotential. The plasma lens may also include a plurality of ringed lens electrodes symmetrically disposed within the lens coil, a center of symmetry being at a center of the lens, and a second power supply being configured to apply power to pairs of ringed lens electrodes to the same electric potential. The process 400 may further include applying an electrical bias to the pairs of ringed lens electrodes, the bias increasing in a direction towards a midpoint of the plasma lens. A high electrical potential may be applied to the pairs of lens electrodes in the vicinity of a center of the lens. Positive ions are directed through the plasma lens to the substrate and are focused to an axial center of the plasma lens as they pass through the plasma lens. Neutral atoms passing through the plasma lens are unaffected. Negative ions are deflected outwardly towards a periphery of the plasma lens and away from the substrate as they pass through the plasma lens.

In some embodiments, the substrate is moved laterally when depositing the film to sequentially expose different portions of the substrate to neutral atoms and positive ions.

In some embodiments employing the plasma lens, transparent conducting oxides are deposited on a substrate using magnetron sputtering, as noted above. In these embodiments, residual oxygen in the system, or introduced along with the argon sputtering gas, is ionized by the taking up of free electrons near the area of the target to form negative oxygen ions, the negative oxygen ions accelerated to the substrate by the same field which accelerates the sputtering ions to the surface of the target. By way of example, for a doped zinc oxide such as AZO, a transparent conductor, it has also been found that by having a limited amount of oxygen present in the chamber, rates are further increased in a $Zn+O_2$ reaction, where temperatures of the substrate are about 200° C. to 250° C. Here, in this reactive deposition process, it is believed that Zn evaporates from the substrate surface unless it links with oxygen. As the lens also carries activated oxygen that is part of the plasma to the substrate, more oxygen is available for the reaction described. By using the lens, the deposition rate can be increased by a factor of up to 10, which is believed due to the activation of the oxygen.

An application of the methods disclosed herein includes the formation of transparent conducting oxide films which are used in solar cells, flat panels, electrochromic windows, touch screens, etc. One such film of great importance is the material AZO, aluminum doped zinc oxide, which is a leading contender for the replacement of the expensive but currently generally better-performing film indium tin oxide. In addition to oxide films in general, the application of methods disclosed herein are relevant to any magnetron process in which the generation of negative ions affect film quality, such as in the deposition of CaF, which suffers from energetic $F^-$ ion bombardment.

The embodiments can also be used for those processes that make use of energetic condensation processes for the deposition of dense, macroparticle-free, high-quality compound films. Examples include: (1) hard, wear resistant coatings, e.g., for automotive engines and tools; (2) dense optical films, scratch resistant films and transparent conductors, e.g., for high-end solar panels, touch screens, smart phones, flat panel displays, electrochromic windows, OLEDs, and the like.

Having thus described the configuration and use of the plasma lens of the embodiments, various extensions and modifications to the above are possible, and are considered to be within the scope of the disclosed embodiments. Below are some examples.

1) The balancing of the magnetron is important for the leakage of plasma into the lens structure. The magnetic field of the magnetron will interact with the magnetic field of the lens. The polarity of those fields needs to be matched as to promote plasma leakage; this can be practically seen by reversing the direction of the current through the lens' magnetic coil. Should the coil's magnetic field point in the "wrong" direction, the plasma output of the lens is much reduced due to poor magnetron-lens coupling.

2) Additional, auxiliary coils can be placed to further improve plasma flow and lensing effect. Those additional coils could include the region of the target and the region behind the substrate.

3) The magnetic field can be established with sets of suitable permanent magnets.

4) The set of discrete lens electrodes could be replaced by a sheet exhibiting a potential gradient, e.g., produced by a current flowing through the resistive sheet. This would smooth the electric field which otherwise shows steps associated with the discrete nature of the potential on the lens electrodes.

5) The system can be scaled in radius (for a cylindrically symmetric system), or scaled in length (for a linear system, wherein for example, the long axis could be out of the plane of the paper of FIG. 1, thus having a rectangular cross-section in one aspect).

6) Additional plasma may be produced or injected into the lens zone.

The embodiments have been described herein in considerable detail to provide those skilled in the art with information relevant to apply the novel principles and to construct and use such specialized components as are required. However, it is to be understood that the embodiments can be carried out by different equipment, materials, and devices, and that various modifications, both as to the equipment and operating procedures, can be accomplished without departing from the scope of the embodiments.

What is claim is:

1. An apparatus comprising:
    a magnetron including a target holder configured to hold a target;
    a support configured to hold a substrate upon which a layer containing material from the target is to be deposited, the support being positioned opposite the target; and
    a plasma lens, the plasma lens being disposed between the magnetron and the support, the plasma lens defining a line of sight path from the target to the support, the plasma lens operable to disperse negatively charged particles away from a center of the plasma lens as the negatively charged particles pass through the plasma lens, and the plasma lens operable to focus positively charged particles to the center of the plasma lens as the positively charged particles pass though the plasma lens, the plasma lens comprising:
        a lens coil including multiple turns, the lens coil disposed about the line of sight path at a position along the line of sight path, and
        a plurality of lens electrodes disposed at the position along the line of sight path, each of the lens electrodes forming a perimeter around the line of sight path, lens electrodes of the plurality of lens electrodes forming pairs of lens electrodes.

2. The apparatus of claim 1, further comprising:
a first power supply operable to apply power to the lens coil to generate a magnetic field that forms lines of equipotential.

3. The apparatus of claim 1, further comprising:
a second power supply operable to apply potential to each of the pairs of lens electrodes.

4. The apparatus of claim 3, wherein the second power supply is operable to apply a high potential to a center pair of lens electrodes, and wherein the second power supply is operable to apply a potential to other pairs of lens electrodes with the potential decreasing in directions moving along the line of sight path, away from the center pair of lens electrodes.

5. The apparatus of claim 1, further comprising:
a heater associated with the support.

6. The apparatus of claim 1, further comprising:
a shield disposed between the support and an end of the plasma lens proximate the support, wherein the shield is operable to block negatively charged particles which have traveled through the plasma lens from the target towards the support.

7. The plasma lens of claim 3, wherein the second power supply comprises a plurality of power supplies.

8. The plasma lens of claim 3, wherein the second power supply comprises a single power supply including a stiff voltage divider.

9. The apparatus of claim 1, wherein the plasma lens has a cylindrical shape, and wherein the plasma lens has a substantially circular cross-section.

10. The apparatus of claim 1, wherein the plasma lens has an elongated cross-section, wherein one dimension is substantially larger than a dimension substantially perpendicular to it, and wherein the plasma lens has a flat-elliptical cross-section or a rectangular cross-section.

11. The apparatus of claim 1, further comprising:
a vacuum chamber, the vacuum chamber housing the magnetron, the support, and the plasma lens.

12. A method of depositing a film comprising:
providing an apparatus including:
a magnetron including a target holder configured to hold a target;
a support configured to hold a substrate upon which a layer containing material from the target is to be deposited, the substrate support being positioned opposite the target; and
a plasma lens, the plasma lens being disposed between the magnetron source and the support, the plasma lens defining a line of sight path from the target to the support, the plasma lens comprising:
a lens coil including multiple turns, the lens coil disposed about the line of sight path at a position along the line of sight path, and
a plurality of lens electrodes disposed at the position along the line of sight path, each of the lens electrodes forming a perimeter around the line of sight path, lens electrodes of the plurality of lens electrodes forming pairs of lens electrodes;
applying a potential to the target;
forming an ionized plasma with a sputtering gas; and
applying power to the plasma lens to disperse negatively charged particles away from a center of the plasma lens as the negatively charged particles pass through the plasma lens and to focus positively charged particles to the center of the plasma lens as the positively charged particles pass though the plasma lens.

13. The method of claim 12, wherein the apparatus further comprises:
a first power supply operable to apply power to the lens coil to generate a magnetic field including lines of equipotential.

14. The method of claim 12, wherein the target is cooled when depositing the layer.

15. The method of claim 12, wherein the substrate is moved laterally when depositing the layer to sequentially expose different portions of the substrate to neutral atoms and the positively charged particles.

16. The method of claim 12, wherein the layer being deposited is doped ZnO, wherein the target comprises doped Zn, wherein the sputtering gas comprises argon, and wherein oxygen is input to the apparatus with the argon.

17. The method of claim 12, wherein the substrate is heated when depositing the layer.

18. The method of claim 12, wherein the apparatus further comprises:
a second power supply operable to apply potential to the pairs of lens electrodes.

19. The method of claim 12, wherein applying power to the plasma lens includes applying potential to the pairs of lens electrodes, including applying a high potential to a center pair of lens electrodes and applying a potential to other pairs of lens electrodes with the potential decreasing in directions moving along line of sight path, away from the center pair of lens electrodes.

20. The method of claim 12, wherein the apparatus further comprises:
a vacuum chamber, the vacuum chamber housing the magnetron, the support, and the plasma lens.

* * * * *